US012635552B2

(12) United States Patent
Araki et al.

(10) Patent No.: US 12,635,552 B2
(45) Date of Patent: May 19, 2026

(54) Ag ALLOY BONDING WIRE FOR SEMICONDUCTOR DEVICE

(71) Applicants: NIPPON MICROMETAL CORPORATION, Saitama (JP); NIPPON STEEL Chemical & Material Co., Ltd., Tokyo (JP)

(72) Inventors: Noritoshi Araki, Saitama (JP); Takumi Ookabe, Saitama (JP); Daizo Oda, Saitama (JP); Tomohiro Uno, Tokyo (JP); Tetsuya Oyamada, Tokyo (JP)

(73) Assignees: Nippon Micrometal Corporation, Saitama (JP); NIPPON STEEL Chemical & Material Co., Ltd., Tokyo (JP)

( * ) Notice: Subject to any disclaimer, the term of this patent is extended or adjusted under 35 U.S.C. 154(b) by 446 days.

(21) Appl. No.: 18/032,151

(22) PCT Filed: Sep. 24, 2021

(86) PCT No.: PCT/JP2021/035095
§ 371 (c)(1),
(2) Date: Apr. 14, 2023

(87) PCT Pub. No.: WO2022/085365
PCT Pub. Date: Apr. 28, 2022

(65) Prior Publication Data
US 2023/0402422 A1      Dec. 14, 2023

(30) Foreign Application Priority Data
Oct. 20, 2020    (JP) ................................. 2020-175760

(51) Int. Cl.
*H01L 23/00*        (2006.01)

(52) U.S. Cl.
CPC .... *H01L 24/45* (2013.01); *H01L 2224/45139* (2013.01); *H01L 2924/01031* (2013.01); *H01L 2924/01046* (2013.01); *H01L 2924/01049* (2013.01); *H01L 2924/01051* (2013.01); *H01L 2924/01052* (2013.01); *H01L 2924/01078* (2013.01); *H01L 2924/01083* (2013.01); *H01L 2924/013* (2013.01)

(58) Field of Classification Search
CPC .......... H01L 24/45; H01L 2224/45139; H01L 2924/01031; H01L 2924/01046; H01L 2924/01049; H01L 2924/01051; H01L 2924/01052; H01L 2924/01078; H01L 2924/01083; H01L 2924/013; H01L 24/48; H01L 21/60; C22C 5/06; C22F 1/14; B23K 35/3006
See application file for complete search history.

(56) References Cited

U.S. PATENT DOCUMENTS

| | | | |
|---|---|---|---|
| 2012/0263624 A1 | 10/2012 | Chiba et al. | |
| 2014/0302317 A1 | 10/2014 | Antoku et al. | |
| 2017/0110430 A1 | 4/2017 | Oyamada et al. | |
| 2017/0216974 A1* | 8/2017 | Yamada | C22C 9/00 |
| 2018/0133843 A1* | 5/2018 | Yamada | C22C 5/04 |
| 2020/0350273 A1 | 11/2020 | Antoku et al. | |
| 2020/0395330 A1 | 12/2020 | Chiba et al. | |

FOREIGN PATENT DOCUMENTS

| | | |
|---|---|---|
| CN | 103985687 A | 8/2014 |
| CN | 104103616 A | 10/2014 |
| CN | 104157625 A | 11/2014 |
| CN | 107004613 A | 8/2017 |
| CN | 111276459 A | 6/2020 |
| CN | 111344846 A | 6/2020 |
| JP | 60-162741 A | 8/1985 |
| JP | 64-17436 A | 1/1989 |
| JP | H01-110741 A | 4/1989 |
| JP | 11-043750 A | 2/1999 |
| JP | H11-288962 A | 10/1999 |
| JP | 2001-176912 A | 6/2001 |
| JP | 2012-049198 A | 3/2012 |
| JP | 2012-169374 A | 9/2012 |
| JP | 2014-201797 A | 10/2014 |
| JP | 2014-222725 A | 11/2014 |
| JP | 2016-025114 A | 2/2016 |
| JP | 2019-186218 A | 10/2019 |
| KR | 2014-0121330 A | 10/2014 |
| TW | 201639972 A | 11/2016 |
| TW | 202115799 A | 4/2021 |

(Continued)

OTHER PUBLICATIONS

Second Office Action dated Dec. 12, 2024, from corresponding Chinese Patent Application No. 202180071142.5, 25 pages.

(Continued)

*Primary Examiner* — Teresa M. Arroyo
(74) *Attorney, Agent, or Firm* — Rimon P.C.

(57) ABSTRACT

There is provided a novel Ag alloy bonding wire for semiconductor devices which provides an excellent bonded ball shape during ball bonding, which is required for high-density packaging. The Ag alloy bonding wire for semiconductor devices is made of an Ag alloy that contains one or more elements selected from the group consisting of Te, Bi and Sb and that satisfies at least one of the following conditions (1) to (3):

(1) a concentration of Te is 5 to 500 at. ppm;
(2) a concentration of Bi is 5 to 500 at. ppm; and
(3) a concentration of Sb is 5 to 1,500 at. ppm.

20 Claims, No Drawings

(56) References Cited

FOREIGN PATENT DOCUMENTS

| WO | 2016/006326 A1 | 1/2016 |
| WO | 2019193771 A1 | 10/2019 |
| WO | 2020/208839 A1 | 10/2020 |
| WO | 2021/065306 A1 | 4/2021 |

OTHER PUBLICATIONS

International Search Report issued in corresponding International Patent Application No. PCT/JP2021/035095, filed Nov. 30, 2021, with English translation.
Extended European Search Report received in corresponding to EP Patent Application No. 21882506.5, dated Jan. 30, 2025.
Office Action dated Jul. 3, 2024, from corresponding CN Application No. 202180071142.5, 17 pages.
Office Action dated Aug. 27, 2024, in corresponding Japanese Patent Application No. 2022-557326, 7 pages.
Office Action dated Nov. 8, 2024, in corresponding Taiwanese Patent Application No. 110138512, 10 pages.
Office Action issued Dec. 11, 2024, in corresponding Korean Patent Application No. 10-2013-7012812, 13 pages.
Office Action dated Sep. 15, 2025, from corresponding Taiwanese Application No. 110138512.

* cited by examiner

Ag ALLOY BONDING WIRE FOR SEMICONDUCTOR DEVICE

CROSS-REFERENCE OF RELATED APPLICATIONS

This application is the U.S. National Phase under 35 U.S.C. § 371 of International Patent Application No. PCT/JP2021/035095, filed on Sep. 24, 2021, which in turn claims the benefit of Japanese Patent Application No. 2020-175760, filed on Oct. 20, 2020, the entire disclosures of which Applications are incorporated by reference herein.

TECHNICAL FIELD

The present invention relates to an Ag alloy bonding wire for semiconductor devices. Furthermore, the present invention relates to a semiconductor device including the Ag alloy bonding wire.

BACKGROUND ART

In a semiconductor device, electrodes formed on a semiconductor element are connected with external electrodes such as a lead frame or electrodes on a substrate using a bonding wire. In a bonding process of a bonding wire, a tip end of wire is heated and melted by arc heat input to form a free air ball (FAB: Free Air Ball) through surface tension, and then this ball part is compression-bonded (hereinafter referred to as "ball-bonded") onto the electrode on the semiconductor chip. Next, a loop is formed, and finally a wire part is compression-bonded (hereinafter referred to as "wedge-bonded") onto external electrodes such as the lead frame or electrodes on the substrate.

Gold (Au) has been the common material of bonding wires, but recently the development of the bonding wire using a relatively inexpensive material as a replacement for Au is actively made because of the sharp rise of Au prices. For example, copper (Cu) and silver (Ag) have been examined for the low cost wire material as a replacement for Au. In particular, silver (Ag) is expected because it has an electrical conductivity equal to or higher than Au and provides a lower hardness than Cu (as a result, Ag is less likely to cause problems during connection to electrodes and the like). For example, Patent Literatures 1 and 2 disclose an Ag alloy wire in which an element such as Pt, Pd or Au is added, and describe that such an Ag alloy wire has a favorable bond reliability.

RELATED ART REFERENCE

Patent Literature

Patent Literature 1: JP-A-H11-288962
Patent Literature 2: JP-A-2012-169374

SUMMARY OF INVENTION

Problem to be Solved by the Invention

In recent years, further improvement in performance of semiconductor devices and further miniaturization of semiconductor devices have been promoted. In development of bonding wires, there is a strong demand for high-density packaging. Fine-pitch bonding required for high-density packaging needs a technique for controlling a bonded ball shape during ball bonding, in addition to technologies in wire-thinning and small ball formation. The problem with the bonded ball shape is that, during ball bonding, the ball deforms into a petaloid shape, or the ball deforms preferentially in the direction in which ultrasonic waves are applied, resulting in anisotropy in the ball deformation (hereinafter referred to as "defective deformation"). Such defective deformation causes failures such as a decrease in bond strength due to an insufficient transmission of ultrasonic waves during ball bonding and a short circuit due to contact between adjacent balls. Therefore, the bonded ball shape is preferably a shape close to a true circle when the ball is observed from directly above the electrode. In this regard, an Ag wire tends to be inferior in the bonded ball shape compared to an Au wire and a Cu wire. The Ag alloy wires described in Patent Literatures 1 and 2 sometimes provide a poor bonded ball shape.

An object of the present invention is to provide a novel Ag alloy bonding wire for semiconductor devices which provides an excellent bonded ball shape during ball bonding, which is required for high-density packaging.

Means for Solving Problem

As a result of earnest investigation as to the problem described above, the present inventors have found that the problem described above can be solved by the bonding wire having the configuration described below, and completed the present invention.

That is, the present invention includes the following content.

<1> An Ag alloy bonding wire for semiconductor devices, being made of an Ag alloy that contains one or more elements selected from the group consisting of Te, Bi and Sb (hereinafter referred to as a "first element") and satisfies at least one of the following conditions (1) to (3):

(1) a concentration of Te is 5 to 500 at. ppm;
(2) a concentration of Bi is 5 to 500 at. ppm; and
(3) a concentration of Sb is 5 to 1,500 at. ppm.

<2> The Ag alloy bonding wire according to <1>, further containing one or more elements selected from the group consisting of Pd, Pt, In and Ga (hereinafter referred to as a "second element"), and a total concentration of the second element is 0.05 to 3 at. %.

<3> The Ag alloy bonding wire according to <1> or <2>, wherein a total concentration of other elements calculated by the following Formula (1) is 0.1 at. % or less, $$100-(x_1+x_2+x_{Ag}) \text{ [at. \%]} \qquad \text{Formula (1):}$$

where $x_1$ is a total concentration of the first element [at. %], $x_2$ is a total concentration of elements selected from the group consisting of Pd, Pt, In and Ga ("second element") [at. %], and $x_{Ag}$ is a concentration of Ag [at. %].

<4> The Ag alloy bonding wire according to any one of <1> to <3>, wherein a balance of the Ag alloy consists of Ag and inevitable impurities.

<5> The Ag alloy bonding wire according to any one of <1> to <4>, wherein the concentration of Sb is 900 to 1,500 at. ppm regarding the condition (3).

<6> The Ag alloy bonding wire according to any one of <1> to <5>, wherein the concentration of each element is a concentration measured by an ICP emission spectrometry or an ICP mass spectrometry.

<7> A semiconductor device comprising the Ag alloy bonding wire according to any one of <1> to <6>.

Effect of the Invention

The present invention can provide a novel Ag alloy bonding wire for semiconductor devices which provides an excellent bonded ball shape during ball bonding, which is required for high-density packaging.

EMBODIMENT FOR CARRYING OUT THE INVENTION

Hereinafter, the present invention will be described in detail with reference to preferable embodiments thereof.
[Ag Alloy Bonding Wire for Semiconductor Devices]

An Ag alloy bonding wire for semiconductor devices according to the present invention (hereinafter also simply referred to as a "wire of the present invention" or a "wire") is made of an Ag alloy that contains one or more elements selected from the group consisting of Te, Bi and Sb (hereinafter referred to as a "first element") and satisfies at least one of the following conditions (1) to (3):

(1) a concentration of Te is 5 to 500 at. ppm;
(2) a concentration of Bi is 5 to 500 at. ppm; and
(3) a concentration of Sb is 5 to 1,500 at. ppm.

—Te, Bi and Sb (First Element)—

The wire of the present invention is made of an Ag alloy that contains, as the first element, one or more elements selected from the group consisting of Te, Bi and Sb and that satisfies at least one of the condition (1) in which the concentration of Te is 5 to 500 at. ppm, the condition (2) in which the concentration of Bi is 5 to 500 at. ppm, and the condition (3) in which the concentration of Sb is 5 to 1,500 at. ppm. Thus, the wire of the present invention can reduce the anisotropy in ball deformation during ball bonding to make the bonded ball shape close to a true circle. Although a detailed mechanism is not clear, it is considered that the specific first elements are segregated in a grain boundary and the like to suppress a coarsening of crystal grain, and a favorable bonded ball shape can be achieved.

—Condition (1)—

The condition (1) relates to the concentration of Te in the wire. From the viewpoint of achieving a favorable bonded ball shape during ball bonding, the concentration of Te in the wire is 5 at. ppm or more, and preferably 10 at. ppm or more, 20 at. ppm or more, 30 at. ppm or more, 40 at. ppm or more, or 50 at. ppm or more. In particular, when the concentration of Te in the wire is 50 at. ppm or more, it is preferable because a further favorable bonded ball shape can be achieved during small-ball bonding. The concentration of Te in the wire is more preferably 60 at. ppm or more, 70 at. ppm or more, or 80 at. ppm or more.

From the viewpoint of achieving a favorable FAB shape and thus achieving a favorable bonded ball shape, the upper limit of the concentration of Te in the wire is 500 at. ppm or less, and preferably 480 at. ppm or less, 460 at. ppm or less, 450 at. ppm or less, 440 at. ppm or less, 420 at. ppm or less, or 400 at. ppm or less.

—Condition (2)—

The condition (2) relates to the concentration of Bi in the wire. From the viewpoint of achieving a favorable bonded ball shape during ball bonding, the concentration of Bi in the wire is 5 at. ppm or more, and preferably 10 at. ppm or more, 20 at. ppm or more, 30 at. ppm or more, 40 at. ppm or more, or 50 at. ppm or more. In particular, when the concentration of Bi in the wire is 50 at. ppm or more, it is preferable because a further favorable bonded ball shape can be achieved during small-ball bonding. The concentration of Bi in the wire is more preferably 60 at. ppm or more, 70 at. ppm or more, or 80 at. ppm or more.

From the viewpoint of achieving a favorable FAB shape and thus achieving a favorable bonded ball shape, the upper limit of the concentration of Bi in the wire is 500 at. ppm or less, and preferably 480 at. ppm or less, 460 at. ppm or less, 450 at. ppm or less, 440 at. ppm or less, 420 at. ppm or less, or 400 at. ppm or less.

—Condition (3)—

The condition (3) relates to the concentration of Sb in the wire. From the viewpoint of achieving a favorable bonded ball shape during ball bonding, the concentration of Sb in the wire is 5 at. ppm or more, and preferably 10 at. ppm or more, 20 at. ppm or more, 30 at. ppm or more, 40 at. ppm or more, or 50 at. ppm or more. In particular, when the concentration of Sb in the wire is 50 at. ppm or more, it is preferable because a further favorable bonded ball shape can be achieved during small-ball bonding. The concentration of Sb in the wire is more preferably 60 at. ppm or more, 70 at. ppm or more, 80 at. ppm or more, or 90 at. ppm or more. Also, the concentration of Sb in the wire may be set higher. The concentration of Sb in the wire may be, for example, 900 at. ppm or more, 920 at. ppm or more, 940 at. ppm or more, 950 at. ppm or more, 960 at. ppm or more, 980 at. ppm or more, or 1,000 at. ppm or more. From the viewpoint of achieving a favorable FAB shape and thus achieving a favorable bonded ball shape, the upper limit of the concentration of each of Te and Bi is preferably 500 at. ppm or less. However, it has been found that a favorable FAB shape can be maintained even when Sb is contained in a higher concentration. Thus, in an embodiment, regarding the condition (3), the concentration of Sb is 900 to 1,500 at. ppm.

From the viewpoint of achieving a favorable FAB shape and thus achieving a favorable bonded ball shape, the upper limit of the concentration of Sb in the wire is 1,500 at. ppm or less, and preferably 1,450 at. ppm or less, 1,400 at. ppm or less, 1,380 at. ppm or less, 1,360 at. ppm or less, or 1,350 at. ppm or less.

As described above, the wire of the present invention satisfies at least one of the conditions (1) to (3). The wire of the present invention may satisfy only one of the conditions (1) to (3), may satisfy any two of the conditions (1) to (3), and may satisfy all of the conditions (1) to (3).

From the viewpoint of achieving a favorable FAB shape and thus achieving a favorable bonded ball shape, the total concentration of the first element in the wire of the present invention is preferably 2,000 at. ppm or less, more preferably 1,800 at. ppm or less, further preferably 1,700 at. ppm or less, or 1,600 at. ppm or less. The lower limit of the total concentration is not particularly limited so long as the wire of the present invention satisfies at least one of the above-described conditions (1) to (3).

—Pd, Pt, in and Ga (Second Element)—

The wire of the present invention preferably contains, as a second element, one or more elements selected from the group consisting of Pd, Pt, In and Ga. In this case, the present inventors have found that bond reliability required for high-density packaging can be significantly improved as follows in cooperation with an improvement effect of bonded ball shape during ball bonding that is achieved by a predetermined amount of the first element contained.

It has been known that a conventional bonding wire formed using Ag has a lower bond reliability than an Au bonding wire. Specifically, it has been known that a ball bonding part of the Ag bonding wire has a shorter life span than the Au bonding wire in evaluation of bond reliability (in particular, a highly accelerated temperature and humidity stress test). In the evaluation of bond reliability, a high-temperature storage life test, the highly accelerated temperature and humidity stress test, and the like are performed to evaluate the life span of the ball bonding part in an actual usage environment of a semiconductor device. The highly accelerated temperature and humidity stress test (HAST: highly accelerated temperature and humidity stress test) includes the bHAST in which a bias voltage is applied and the uHAST in which a bias voltage is not applied. The bHAST is a severer test than the uHAST since corrosion is accelerated by the application of a bias voltage.

In the techniques in Patent Literatures 1 and 2 described above, a dopant such as Pd is added to improve the bond reliability of the Ag bonding wire. However, in the high-density packaging in which small-ball bonding is performed, it is found that a sufficient bond reliability cannot be sometimes achieved even with such techniques. As for a case where a wire with a wire diameter of φ15 to 25 μm is used, in the typical bonding, a ball having a ball diameter of 1.7 to 2.0 times the wire diameter is formed and then the bonding is performed. In contrast, in an application of the high-density packaging, a small ball having a ball diameter of 1.5 to 1.6 times the wire diameter is often formed and then the bonding is performed in order to deal with fine-pitch application. In the high-density packaging, the small-ball bonding is performed as described above, and therefore an area contributing to the bond becomes small. As a result, it is further difficult to ensure the bond life of the ball bonded part.

In contrast, the wire of the present invention that is made of an Ag alloy containing a predetermined amount of the first element can reduce the anisotropy in ball deformation during ball bonding to achieve a bonded ball shape close to a true circle. Thus, even during small-ball bonding, the area contributing to the bond can be ensured as much as possible while preventing a short circuit due to contact between adjacent balls. When the wire of the present invention further contains the second element described above, the effect achieved by the predetermined amount of the first element contained and the improvement effect on the bond reliability achieved by the second element contained are synergistically exhibited. Thus, a bonded ball shape close to a true circle is stably achieved, and the bond reliability required for high-density packaging can be significantly improved.

From the viewpoint of significantly improving the bond reliability required for high-density packaging, it is preferable that the wire of the present invention contains, as the second element, one or more elements selected from the group consisting of Pd, Pt, In and Ga as described above in combination with the first element. The present inventors have found that when the specific second element described above is contained in combination with the first element, a stable bonded ball shape can be achieved, and the bond reliability can also be improved. Although a detailed mechanism is not clear, it is considered that the specific second element suppresses the growth of intermetallic compound of Ag and an electrode metal (Al, etc.) that may cause a corrosion in a bonding interface of the ball bonded part, so that the bond reliability can be improved.

From the viewpoint of significantly improving the bond reliability required for high-density packaging, the total concentration of the second element in the wire is preferably 0.05 at. % or more, more preferably 0.1 at. % or more, 0.2 at. %, or more, 0.3 at. % or more, 0.4 at. %, or more, 0.5 at. %, or more, 0.6 at. % or more, 0.8 at. %, or more, or 1 at. % or more, in combination with the first element. In particular, when the total concentration of the second element is 0.3 at. % or more, it is preferable because a more favorable bond reliability can be achieved. When the total concentration is 0.5 at. % or more, it is preferable because a further favorable bond reliability can be achieved.

From the viewpoint of preventing hardening of the wire to suppress the chip damage, the upper limit of the total concentration of the second element in the wire is preferably 3 at. % or less, more preferably 2.9 at. % or less, 2.8 at. %, or less, 2.7 at. % or less, 2.6 at. %, or less, or 2.5 at. % or less. The wire of the present invention containing the second element in combination with the first element can improve the bond reliability required for high-density packaging without excessively increasing the additive amount of the second element.

Accordingly, in a preferable embodiment, the wire of the present invention further contains one or more elements selected from the group consisting of Pd, Pt, In and Ga ("second element"), and the total concentration of the second element is 0.05 to 3 at. %.

The wire of the present invention may contain, as the second element, one or more elements of Pd, Pt, In and Ga. Specifically, the wire of the present invention may contain all of the four elements, may contain any three or two of the elements, or may contain only any one of the elements.

In an embodiment, the wire of the present invention substantially contains only any one element of Pd, Pt, In and Ga among the second elements. Herein, the phrase "substantially contains only any one element of Pd, Pt, In and Ga" means that the wire contains any one element of Pd, Pt, In and Ga, and the concentrations of the other three elements are each 50 at. ppm or less. In this case, the concentrations of the other three elements may each be 40 at. ppm or less, 30 at. ppm or less, 20 at. ppm or less, or 10 at. ppm or less.

When the wire contains Pd as the second element, the concentration of Pd in the wire is not particularly limited so long as the wire satisfies the preferable value of the above-described total concentration in relation to the concentrations of Pt, In and Ga, and the concentration of Pd in the wire may be, for example, 1 at. % or less, less than 1 at. %, 0.8 at. % or less, less than 0.8 at. %, 0.75 at. % or less, or 0.7 at. % or less.

When the wire contains Pt as the second element, the concentration of Pt in the wire is not particularly limited so long as the wire satisfies the preferable value of the above-described total concentration in relation to the concentrations of Pd, In and Ga, and the concentration of Pt in the wire may be, for example, 0.4 at. % or more, 0.45 at. % or more, 0.5 at. % or more, 0.55 at. % or more, or 0.6 at. % or more.

When the wire contains In as the second element, the concentration of In in the wire is not particularly limited so long as the wire satisfies the preferable value of the above-described total concentration in relation to the concentrations of Pd, Pt and Ga, and the concentration of In in the wire may be, for example, 0.03 at. % (300 at. ppm) or more, 0.035 at. % or more, 0.04 at. % or more, 0.045 at. % or more, or 0.05 at. % or more.

When the wire contains Ga as the second element, the concentration of Ga in the wire is not particularly limited so long as the wire satisfies the preferable value of the above-described total concentration in relation to the concentrations of Pd, Pt and In, and the concentration of Ga in the wire may be, for example, 0.3 at. % or more, 0.35 at. % or more, 0.4 at. % or more, 0.45 at. % or more, or 0.5 at. % or more.

The wire of the present invention is made of the Ag alloy containing a predetermined amount of the first element and also the above-described second element as necessary. The balance, the remaining part, of the Ag alloy includes Ag. In the wire of the present invention, from the viewpoint of further achieving the effect of the present invention, the concentration of Ag relative to the entire wire is preferably 95 at. %, or more, more preferably 96 at. % or more, 96.5 at. % or more, 96.6 at. % or more, 96.7 at. % or 96.8 at. % or more.

The wire of the present invention may further contain an element other than the first element, the second element, and Ag (hereinafter also referred to as "other element(s)") in a range of not inhibiting the effect of the present invention. The total concentration of the other element(s) in the wire is not particularly limited so long as it does not inhibit the effect of the present invention. The total concentration of the other element(s) may be, for example, 0.5 at. % or less. Accordingly, the total concentration of the other element(s) calculated by the following Formula (1) may be 0.5 at. % or less, $$100-(x_1+x_2+x_{Ag}) \ [\text{at. } \%] \hspace{2cm} \text{Formula (1):}$$

where $x_1$ is the total concentration of the first element [at. %], $x_2$ is the total concentration of the second element [at. %], and $x_{Ag}$ is the concentration of Ag [at. %].

The total concentration of an element other than the first element, the second element and Ag, that is, the other element(s) may be lower, and may be, for example, 0.4 at. % or less, 0.3 at. % or less, 0.2 at. % or less, 0.15 at. % or less, 0.1 at. % or less, 0.08 at. % or less, 0.06 at. % or less, 0.05 at. % or less, 0.04 at. % or less, 0.02 at. % or less, 0.011 at. % or less, or 0.01 at. % or less. The lower limit of the total concentration of the other element(s) is not particularly limited, and may be 0 at. %.

For example, when the wire contains Ca or a rare earth element as the other element(s), the total concentration of Ca and the rare earth element in the wire may be less than 20 at. ppm. The total concentration of Ca and the rare earth element in the wire may be lower, and may be, for example, 18 at. ppm or less, 16 at. ppm or less, 15 at. ppm or less, 14 at. ppm or less, 12 at. ppm or less, 10 at. ppm or less, 8 at. ppm or less, 6 at. ppm or less, or 5 at. ppm or less. The lower limit of the total concentration is not particularly limited, and may be 0 at. ppm.

In a preferable embodiment, the wire of the present invention is made of an Ag alloy that contains the first element and the second element in combination, and the balance consisting of Ag and inevitable impurities.

The concentration of elements contained in the wire of the present invention such as the first element, the second element and other element(s) can be detected as the concentration of elements contained in the entire wire by analyzing a liquid in which the wire is dissolved with a strong acid using an ICP emission spectrometer or an ICP mass spectrometer. The concentration of each element specified in the present invention is based on the concentration measured by an ICP emission spectrometry or an ICP mass spectrometry.

The wire of the present invention preferably does not have a coating that contains a metal other than Ag as a main component. Accordingly, in a preferable embodiment, the wire of the present invention does not have a coating that contains a metal other than Ag as a main component. Herein, the "coating that contains a metal other than Ag as a main component" means the coating in which the content of the metal other than Ag is 50 at. % or more.

A diameter of the wire of the present invention is not particularly limited, and may be appropriately determined depending on specific purposes. Preferably, the diameter of the wire may be 15 μm or more, 18 μm or more, 20 μm or more, or the like. An upper limit of the diameter is not particularly limited, but may be 100 μm or less, 90 μm or less, 80 μm or less, or the like.

8

<Manufacturing Method for Wire>

There will be described an example of a method for manufacturing the Ag alloy bonding wire for semiconductor devices of the present invention.

Raw material silver (Ag) of a purity of 3 N to 5 N (99.9 to 99.9991 by mass or more) is prepared. Then, after weighing the raw material Ag, the first element, the second element and other element(s) as a starting material so that the concentration of the first element (and also the concentration of the second element and other dopant element(s) if contained) falls within the specific range described above, these materials are melted and mixed to obtain an Ag alloy. Alternatively, as the raw materials such as the first element, the second element and other element(s), a mother alloy containing these elements may be used. The resultant Ag alloy is processed to have a large diameter by continuous casting, and subsequently, thinned to have a final wire diameter by wire-drawing process.

The wire-drawing process can be performed by using a continuous wire-drawing machine in which a plurality of diamond-coated dies can be set. As necessary, an acid cleaning process may be performed prior to the wire-drawing process. Furthermore, a heat treatment may be performed at the intermediate stage of the wire-drawing process.

After the wire-drawing process, a final heat treatment is performed. Regarding a temperature condition for the final heat treatment, for example, the breaking elongation of a heat-treated wire may be checked by changing only a temperature inside a furnace at a fixed wire feeding speed, and a heat treatment temperature may be determined so that the breaking elongation falls within a predetermined range. The heat treatment temperature may fall within a range from 200 to 700° C., for example. It is preferable that a time of the heat treatment is set to be, for example, 10 seconds or less (preferably, 5 seconds or less, 4 seconds or less, or 3 seconds or less). As an atmospheric gas for the heat treatment, there may be used an inert gas such as a nitrogen gas and an argon gas, or an inert gas containing hydrogen such as a forming gas (5% $H_2$—$N_2$).

The wire of the present invention can be used for connecting a first electrode on a semiconductor element to a second electrode on a lead frame or a circuit board when manufacturing the semiconductor device. First connection (1st bonding) with the first electrode on the semiconductor element may be ball bonding, and second connection (2nd bonding) with the electrode on the lead frame or the circuit board may be wedge bonding. In the ball bonding, a tip end of the wire is heated and melted by arc heat input to form a ball (FAB) by surface tension, and then this ball part is bonded onto the heated electrode of the semiconductor element by applying ultrasonic waves and pressure thereto. In the wedge bonding, the wire part is compression-bonded onto the electrode by applying heat, ultrasonic waves, and pressure without forming the ball. The wire of the present invention that is made of the Ag alloy containing a predetermined amount of the first element can reduce the anisotropy in ball deformation during ball bonding to achieve the bonded ball shape close to a true circle. Thus, even during small-ball bonding, the area contributing to the bond can be ensured as much as possible while preventing a short circuit due to contact between adjacent balls. When the wire of the present invention further contains a predetermined amount of the second element, the wire synergistically exhibits such effect achieved by the predetermined amount of the first element contained and the effect of improving the bond reliability achieved by the second element contained, thereby significantly improving the bond reliability required in high-density packaging. Therefore, the wire of the present invention can be suitably used for semiconductor devices, and can be suitably used for high-density packaging semiconductor devices.

[Method for Manufacturing Semiconductor Device]

The semiconductor device can be manufactured by connecting the electrode on the semiconductor element to the electrode on the lead frame or the circuit board by using the Ag alloy bonding wire for semiconductor devices of the present invention.

In an embodiment, the method for manufacturing the semiconductor device of the present invention (hereinafter also simply referred to as a "method of the present invention") includes a step of connecting the first electrode on the semiconductor element to the second electrode on the lead frame or circuit board with using the wire of the present invention, and is characterized in that the first connection between the first electrode and the wire of the present invention is performed by ball bonding and the second connection between the second electrode and the wire of the present invention is performed by wedge bonding.

The use of the wire of the present invention that is made of the Ag alloy containing a predetermined amount of the first element can reduce the anisotropy in ball deformation during ball bonding to achieve the bonded ball shape close to a true circle. Thus, even during small-ball bonding, the area contributing to the bond can be ensured as much as possible while preventing a short circuit due to contact between adjacent balls. The wire of the present invention can also be well adapted to fine-pitch bonding of 50 μm or less, and significantly contributes to promoting the application of Ag wires in high-density packaging applications.

[Semiconductor Device]

The semiconductor device can be manufactured by connecting the electrode on the semiconductor element to the electrode on the lead frame or the circuit board by using the Ag alloy bonding wire for semiconductor devices of the present invention.

In an embodiment, the semiconductor device of the present invention includes a circuit board, a semiconductor element, and a bonding wire for electrically connecting the circuit board and the semiconductor element with each other, and is characterized in that the bonding wire is the wire of the present invention.

In the semiconductor device of the present invention, the circuit board and the semiconductor element are not particularly limited, and a known circuit board and semiconductor element that may be used for constituting the semiconductor device may be used. Alternatively, a lead frame may be used in place of the circuit board. For example, like the semiconductor device disclosed in JP 2020-150116 A and JP 2002-246542 A, the semiconductor device may include a lead frame and a semiconductor element mounted on the lead frame.

Examples of the semiconductor device may include various semiconductor devices used for electric products (for example, a computer, a cellular telephone, a digital camera, a television, an air conditioner, a solar power generation system), vehicles (for example, a motorcycle, an automobile, an electric train, a ship, and an aircraft), and the like. Among these, a high-density packaging semiconductor device that requires the strict control of a bonded ball shape during small-ball bonding is preferred.

EXAMPLES

There will be specifically described the present invention with Examples. However, the present invention is not limited to the Examples described below.

(Sample)

For Ag as a raw material, Ag having a purity of 99.9 at. % or more with the balance composed of inevitable impurities was used. For the first element (Te, Bi and Sb) and the second element (Pd, Pt, In and Ga), those having a purity of 99.9 at. % or more with the balance composed of inevitable impurities were used.

The Ag alloy used for a bonding wire was manufactured by charging raw materials into a cylinder-shaped carbon crucible, heating and melting the raw materials at 1,080 to 1,600° C. in vacuum or in an inert atmosphere such as an $N_2$ or Ar gas using a high-frequency furnace. The resultant alloy was processed to form a wire of φ4 to 6 mm by continuous casting.

The obtained Ag alloy was subjected to wire-drawing process using dies to form a wire of φ300 to 600 μm. Then, the obtained wire was subjected to an intermediate heat treatment of 200 to 700° C. and a wire-drawing process repeatedly to have a final wire diameter of φ20 μm. A commercially available lubricant was used for the wire-drawing, and a wire feeding speed during the wire-drawing was 20 to 600 m/min. The intermediate heat treatment was performed while continuously sweeping the wire under an Ar gas atmosphere. A wire feeding speed during the intermediate heat treatment was 20 to 100 m/min.

After the wire-drawing process, the wire was subjected to the final heat treatment so that the breaking elongation of the wire was finally in a range of about 9 to 25%. The final heat treatment was performed in the same manner as the intermediate heat treatment. A wire feeding speed during the final heat treatment was 20 to 100 m/min similarly to the intermediate heat treatment. The temperature of the final heat treatment was 200 to 700° C. and the time of the heat treatment was 0.2 to 1.0 seconds.

The concentration of the first element and the second element in the bonding wire was detected as the concentration of elements contained in the entire wire by analyzing a liquid in which the bonding wire was dissolved with a strong acid using an ICP emission spectrometer or an ICP mass spectrometer.

(Test and Evaluation Methods)

There will be described test and evaluation methods.

[Bonded Ball Shape]

The evaluation of the bonded ball shape (the crushed shape of ball) was carried out by performing ball bonding using a commercially available wire bonder (Iconn Plus manufactured by K & S) on an electrode that had been formed by depositing an Al film having a thickness of 1.0 μm on an Si substrate, and observing the ball bonding part from directly above by an optical microscope (the number of evaluations N=100). The balls were formed while flowing an $N_2$+5% $H_2$ gas at a flow rate of 0.4 to 0.6 L/min, and the ball diameter was set to 1.5 to 1.6 times the wire diameter. In the determination of the crushed shape of ball, a case in which a crushed shape was close to a true circle was determined to be favorable, and a case in which a crushed shape was an oval shape or a petaloid shape was determined to be fault. Evaluation was then performed in accordance with the following criteria.

Evaluation criteria:
⊚: No failure
○: 1 to 4 failures (no problem for practical use)
X: 5 or more failures

[FAB Shape]

The evaluation of the FAB shape was performed by forming an FAB on a lead frame using a commercially available wire bonder and observing the FAB with a scanning electron microscope (SEM) (evaluation number N=100). The FAB was formed while flowing an $N_2$+5% $H_2$ gas at a flow rate of 0.4 to 0.6 L/min, and the FAB diameter was set to 1.5 to 1.6 times the wire diameter. The FAB shape was determined to be favorable if it had a true spherical shape and determined to be failure if it showed eccentricity or irregular shape. Evaluation was then performed in accordance with the following criteria.

Evaluation Criteria
    ◎: 5 or less failures
    ○: 6 to 10 failures (no problem for practical use)
    X: 11 or more failures

[Evaluation of Bond Reliability]

A sample for bond reliability evaluation was prepared by performing ball bonding using a commercially available wire bonder on an electrode that had been formed by depositing an Al film having a thickness of 1.0 μm on an Si substrate on a common metallic frame, and then sealing with a commercially available epoxy resin. The balls were formed while flowing an $N_2$+5% $H_2$ gas at a flow rate of 0.4 to 0.6 L/min, and the ball diameter was set to 1.5 to 1.6 times the wire diameter.

The bond reliability was evaluated by a highly accelerated temperature and humidity stress test (bHAST). Specifically, the prepared sample for the bond reliability evaluation was exposed to a high-temperature and high-humidity environment with a temperature of 130° C. and a relative humidity of 85% using an unsaturated pressure cooker tester and applied with a 5V bias. The shear test on the ball bonded part was performed every 48 hours, and a time until a value of shear force became half of the initial shear force was determined to be the bonding life of the ball bonded part. The shear test was performed after removing the resin by an acid treatment to expose the ball bonded part.

For a shear tester for HAST evaluation, a tester manufactured by DAGE was used. An average value of measurement values of 10 ball bonded parts randomly selected was used for the value of the shear force. Evaluation was then performed in accordance with the following criteria.

Evaluation criteria:
    ◎◎: bonding life of 288 hours or more
    ◎: bonding life of 144 hours or more and less than 288 hours
    ○: bonding life of 96 hours or more and less than 144 hours
    X: bonding life of less than 96 hours

[Chip Damage]

The evaluation of the chip damage was carried out by performing ball bonding using a commercially available wire bonder on an electrode that had been formed by depositing an Al film having a thickness of 1.0 μm on a Si substrate, dissolving the wire and the Al electrode with a chemical solution to expose the Si substrate, and observing the Si substrate directly below the ball bonded part by an optical microscope (the number of evaluations N=50). Evaluation was then performed in accordance with the following criteria.

Evaluation Criteria
    ○: no crack or bonding traces
    Δ: no crack, but there are sites where bonding traces were confirmed (3 sites or less)
    X: other than the above

[Test Example 1] Investigation of Effect of Addition of First Element

Table 1 shows evaluation results in Examples and Comparative Examples in which the first element was added or not and the additive amount of the first element was changed.

TABLE 1

| | | First element (at. ppm) | | | Second element (at. %) | | | | Crushed shape | FAB shape | Chip damage |
|---|---|---|---|---|---|---|---|---|---|---|---|
| | | Te | Bi | Sb | Pd | Pt | In | Ga | | | |
| Examples | 1 | 5 | | | | | | | ○ | ◎ | ○ |
| | 2 | 100 | | | | | | | ◎ | ◎ | ○ |
| | 3 | 495 | | | | | | | ○ | ○ | ○ |
| | 4 | | 5 | | | | | | ○ | ◎ | ○ |
| | 5 | | 100 | | | | | | ◎ | ◎ | ○ |
| | 6 | | 495 | | | | | | ○ | ○ | ○ |
| | 7 | | | 5 | | | | | ○ | ◎ | ○ |
| | 8 | | | 200 | | | | | ◎ | ◎ | ○ |
| | 9 | | | 1495 | | | | | ○ | ○ | ○ |
| Comparative Examples | 1 | 4 | | | | | | | X | ○ | ○ |
| | 2 | | 3 | | | | | | X | ○ | ○ |
| | 3 | | | 4 | | | | | X | ○ | ○ |
| | 4 | 510 | | | | | | | X | X | ○ |
| | 5 | | 505 | | | | | | X | X | ○ |
| | 6 | | | 1560 | | | | | X | X | ○ |
| | 7 | | | | 0.6 | | | | X | ◎ | ○ |
| | 8 | | | | | 0.4 | | | X | ◎ | ○ |
| | 9 | | | | | | 0.5 | | X | ◎ | ○ |
| | 10 | | | | | | | 0.4 | X | ◎ | ○ |

For the Ag alloy bonding wires in Examples 1 to 9, the concentrations of the first element fell within the range of the present invention, and the bonded ball shape were confirmed to be excellent.

In contrast, for the Ag alloy bonding wires in Comparative Examples 1 to 10, the concentrations of the first element were out of the lower limit or the upper limit of the range of the present invention, and the bonded ball shape were poor.

[Test Example 2] Investigation of Effect of Addition of Second Element

Tables 2 and 3 show evaluation results of Examples and Comparative Examples in which the amount of the first element added was changed, and the second element was added or not and the addition amount of the second element was changed.

TABLE 2

| | | First element (at. ppm) | | | Second element (at. %) | | | | Other element (at. %) | Crushed shape | FAB shape | Bond reliability | Chip damage |
|---|---|---|---|---|---|---|---|---|---|---|---|---|---|
| | | Te | Bi | Sb | Pd | Pt | In | Ga | | | | | |
| Examples | 10 | 5 | | | | | | 0.06 | | ○ | ◎ | ○ | ○ |
| | 11 | 10 | | | | | | 0.1 | | ○ | ◎ | ○ | ○ |
| | 12 | 20 | | | | | | 0.4 | | ○ | ◎ | ◎ | ○ |
| | 13 | 30 | | | | | | 0.7 | | ○ | ◎ | ◎◎ | ○ |
| | 14 | 40 | | | | | | 1 | | ○ | ◎ | ◎◎ | ○ |
| | 15 | 50 | | | | | | 2.8 | | ◎ | ◎ | ◎◎ | ○ |
| | 16 | 100 | | | | | | 2.9 | | ◎ | ◎ | ◎◎ | ○ |

TABLE 2-continued

| | First element (at. ppm) | | | Second element (at. %) | | | | Other element (at. %) | Crushed shape | FAB shape | Bond reliability | Chip damage |
|---|---|---|---|---|---|---|---|---|---|---|---|---|
| | Te | Bi | Sb | Pd | Pt | In | Ga | | | | | |
| 17 | 200 | | | | | | 3 | | ◎ | ◎ | ◎◎ | ○ |
| 18 | 300 | | | | | 0.7 | | | ◎ | ◎ | ◎◎ | ○ |
| 19 | 395 | | | 1.8 | | | | | ◎ | ◎ | ◎◎ | ○ |
| 20 | 450 | | | 0.5 | | 0.5 | | | ○ | ○ | ◎◎ | ○ |
| 21 | 495 | | | | 0.3 | | 0.5 | | ○ | ○ | ◎◎ | ○ |
| 22 | | 5 | | 0.06 | | | | | ○ | ◎ | ○ | ○ |
| 23 | | 10 | | 0.1 | | | | | ○ | ◎ | ○ | ○ |
| 24 | | 20 | | 0.4 | | | | | ○ | ◎ | ◎ | ○ |
| 25 | | 30 | | 0.5 | | | | | ○ | ◎ | ◎ | ○ |
| 26 | | 40 | | 0.6 | | | | | ○ | ◎ | ◎ | ○ |
| 27 | | 50 | | 1 | | | | | ◎ | ◎ | ◎◎ | ○ |
| 28 | | 100 | | 2.8 | | | | | ◎ | ◎ | ◎◎ | ○ |
| 29 | | 150 | | 2.9 | | | | | ◎ | ◎ | ◎◎ | ○ |
| 30 | | 200 | | 3 | | | | | ◎ | ◎ | ◎◎ | ○ |
| 31 | | 300 | | | 2 | | | | ◎ | ◎ | ◎◎ | ○ |
| 32 | | 395 | | | | 1 | | | ◎ | ◎ | ◎◎ | ○ |
| 33 | | 450 | | 1 | | | 0.4 | | ○ | ○ | ◎◎ | ○ |
| 34 | | 495 | | | | 0.4 | | | ○ | ○ | ◎ | ○ |
| 35 | | | 5 | 0.06 | | | | | ○ | ◎ | ○ | ○ |
| 36 | | | 20 | 0.2 | | | | | ○ | ◎ | ○ | ○ |
| 37 | | | 40 | 0.4 | | | | | ○ | ◎ | ◎ | ○ |
| 38 | | | 60 | 0.75 | | | | | ◎ | ◎ | ◎◎ | ○ |
| 39 | | | 80 | 0.8 | | | | | ◎ | ◎ | ◎◎ | ○ |
| 40 | | | 100 | 1 | | | | | ◎ | ◎ | ◎◎ | ○ |
| 41 | | | 200 | 2.8 | | | | | ◎ | ◎ | ◎◎ | ○ |
| 42 | | | 300 | 2.9 | | | | | ◎ | ◎ | ◎◎ | ○ |
| 43 | | | 400 | 3 | | | | | ◎ | ◎ | ◎◎ | ○ |
| 44 | | | 500 | 1 | | 0.2 | | | ◎ | ◎ | ◎◎ | ○ |
| 45 | | | 600 | | | | 0.8 | | ◎ | ◎ | ◎◎ | ○ |
| 46 | | | 700 | | 0.6 | | | | ◎ | ◎ | ◎ | ○ |
| 47 | | | 900 | | | 0.05 | | | ◎ | ◎ | ○ | ○ |
| 48 | | | 1100 | | | 0.1 | | | ◎ | ◎ | ○ | ○ |
| 49 | | | 1200 | | | 0.3 | | | ◎ | ◎ | ◎ | ○ |
| 50 | | | 1250 | | | 0.4 | | | ◎ | ◎ | ◎ | ○ |
| 51 | | | 1300 | | | 0.5 | | | ◎ | ◎ | ◎◎ | ○ |
| 52 | | | 1350 | | | 0.7 | | | ◎ | ◎ | ◎◎ | ○ |
| 53 | | | 1400 | | | 2 | | | ○ | ○ | ◎◎ | ○ |
| 54 | | | 1450 | | | 2.5 | | | ○ | ○ | ◎◎ | ○ |
| 55 | | | 1495 | | | 2.9 | | | ○ | ○ | ◎◎ | ○ |

TABLE 3

| | | First element (at. ppm) | | | Second element (at. %) | | | | Other element (at. %) | Crushed shape | FAB shape | Bond reliability | Chip damage |
|---|---|---|---|---|---|---|---|---|---|---|---|---|---|
| | | Te | Bi | Sb | Pd | Pt | In | Ga | | | | | |
| Examples | 56 | 100 | 100 | | 2.2 | | | | | ◎ | ◎ | ◎◎ | ○ |
| | 57 | 150 | | 1400 | | | 0.8 | | | ◎ | ◎ | ◎◎ | ○ |
| | 58 | | 150 | 1400 | 0.8 | | 0.2 | | | ◎ | ◎ | ◎◎ | ○ |
| | 59 | 100 | | 300 | | 0.3 | | | | ◎ | ◎ | ◎ | ○ |
| | 60 | 50 | 50 | 200 | | 0.4 | | 0.3 | | ◎ | ◎ | ◎◎ | ○ |
| | 61 | 150 | | | 4 | | | | | ◎ | ◎ | ◎◎ | Δ |
| | 62 | | 150 | | | 3.1 | | | | ◎ | ◎ | ◎◎ | Δ |
| | 63 | | | 500 | | | 3.1 | | | ◎ | ◎ | ◎◎ | Δ |
| | 64 | | | 1000 | | | | 3.2 | | ◎ | ◎ | ◎◎ | Δ |
| | 65 | | 20 | | | 0.4 | | | Au: 0.2 | ○ | ◎ | ◎ | ○ |
| | 66 | | | 500 | 1 | | 0.2 | | Cu: 0.3 | ◎ | ◎ | ○ | ○ |
| | 67 | 100 | | | 1.5 | | | | Au: 0.18 P: 0.1 | ◎ | ◎ | ○ | Δ |
| Comparative Examples | 1 | 4 | | | | | | | | X | ○ | X | ○ |
| | 2 | | 3 | | | | | | | X | ○ | X | ○ |
| | 3 | | | 4 | | | | | | X | ○ | X | ○ |
| | 4 | 510 | | | | | | | | X | X | X | ○ |
| | 5 | | 505 | | | | | | | X | X | X | ○ |
| | 6 | | | 1560 | | | | | | X | X | X | ○ |
| | 7 | | | | 0.6 | | | | | X | ◎ | ◎ | ○ |
| | 8 | | | | | 0.4 | | | | X | ◎ | ◎ | ○ |
| | 9 | | | | | | 0.5 | | | X | ◎ | ◎◎ | ○ |
| | 10 | | | | | | | 0.4 | | X | ◎ | ◎ | ○ |
| | 11 | 3 | | | 0.04 | | | | | X | ○ | X | ○ |

15 16

TABLE 3-continued

| | First element (at. ppm) | | | Second element (at. %) | | | | Other element (at. %) | Crushed shape | FAB shape | Bond reliability | Chip damage |
|---|---|---|---|---|---|---|---|---|---|---|---|---|
| | Te | Bi | Sb | Pd | Pt | In | Ga | | | | | |
| 12 | | 4 | | | 0.03 | | | | X | ○ | X | ○ |
| 13 | | | 4 | | | 0.03 | | | X | ○ | X | ○ |
| 4 | | | 4 | | | | 0.04 | | X | ○ | X | ○ |

For the Ag alloy bonding wires in Examples 10 to 60 and 65 to 67, the concentrations of the first element fell within the range of the present invention, the concentrations of the second element fell within the suitable range of the present invention, and the bonded ball shape and the bond reliability were confirmed to be excellent. For the Ag alloy bonding wires in Examples 61 to 64, the bonded ball shape and the bond reliability were excellent, but the concentrations of the second element were out of the upper limit of the suitable range of the present invention. Thus, the results of chip damage tended to be slightly inferior to other Examples.

In contrast, for the Ag alloy bonding wire in Comparative Examples 1 to 14, the concentrations of the first element were out of the range of the present invention, and the bonded ball shape were poor. For the wires in Comparative Examples 1 to 6 and 11 to 14 in which the second element was not added, the bond reliability was also poor.

The invention claimed is:

1. An Ag alloy bonding wire for semiconductor devices comprising:
   one or more first elements selected from the group consisting of Te, Bi and Sb and satisfying at least one of the following conditions (1) to (3):
       (1) a concentration of Te is 5 to 500 at. ppm;
       (2) a concentration of Bi is 5 to 500 at. ppm; and
       (3) a concentration of Sb is 5 to 1,500 at. ppm; and
   one or more second elements selected from the group consisting of Pd, Pt, In and Ga, the one or more second elements including In, wherein a total concentration of the one or more second elements is 3 at. % or less, and a concentration of In is 0.03 at. % or more,
   wherein a total concentration of other elements calculated by the following Formula (1) is 0 at. % or more and 0.5 at. % or less, $$100-(x_1+x_2+x_{Ag}) \text{ in at. \%} \qquad \text{Formula (1):}$$

where $x_1$ is a total concentration of the one or more first elements in at. %, $x_2$ is a total concentration of the one or more second elements in at. %, and $x_{Ag}$ is a concentration of Ag in at. %.

2. The Ag alloy bonding wire according to claim 1, wherein the total concentration of the one or more second elements is 0.05 to 3 at. %.

3. The Ag alloy bonding wire according to claim 1, wherein the total concentration of the other elements is 0 at. % or more and 0.1 at. % or less.

4. The Ag alloy bonding wire according to claim 1, wherein the concentration of Sb is 900 to 1,500 at. ppm regarding the condition (3).

5. The Ag alloy bonding wire according to claim 1, wherein the concentration of each element is a concentration measured by an ICP emission spectrometry or an ICP mass spectrometry.

6. A semiconductor device comprising the Ag alloy bonding wire according to claim 1.

7. An Ag alloy bonding wire for semiconductor devices comprising:
   one or more first elements selected from the group consisting of Te, Bi and Sb and satisfying at least one of the following conditions (1) to (3):
       (1) a concentration of Te is 5 to 500 at. ppm;
       (2) a concentration of Bi is 5 to 500 at. ppm; and
       (3) a concentration of Sb is 5 to 1,500 at. ppm; and
   one or more second elements selected from the group consisting of Pd, Pt, In and Ga, the one or more second elements including Ga, wherein a total concentration of the one or more second elements is 3 at. % or less,
   wherein a total concentration of other elements calculated by the following Formula (1) is 0 at. % or more and 0.5 at. % or less, $$100-(x_1+x_2+x_{Ag}) \text{ in at. \%} \qquad \text{Formula (1):}$$

where $x_1$ is a total concentration of the one or more first elements in at. %, $x_2$ is a total concentration of the one or more second elements in at. %, and $x_{Ag}$ is a concentration of Ag in at. %.

8. The Ag alloy bonding wire according to claim 7, wherein a concentration of Ga is 0.06 at. % or more.

9. The Ag alloy bonding wire according to claim 1, wherein the Ag alloy bonding wire does not contain Pt.

10. The Ag alloy bonding wire according to claim 1, wherein the Ag alloy bonding wire contains Pt and a concentration of Pt is 0.1 at. % or less.

11. The Ag alloy bonding wire according to claim 1, wherein the Ag alloy bonding wire contains Pt and a concentration of Pt is 0.06 at. % or less.

12. The Ag alloy bonding wire according to claim 1, wherein the total concentration of the one or more second elements is 1 at. % or less.

13. The Ag alloy bonding wire according to claim 1, wherein concentrations of Pd, Pt, and Ga are each 50 at. ppm or less.

14. The Ag alloy bonding wire according to claim 1, wherein the one or more first elements comprise at least two or more elements selected from the group consisting of Te, Bi and Sb.

15. The Ag alloy bonding wire according to claim 1, wherein the total concentration of the one or more first elements is 2,000 at. ppm or less.

16. The Ag alloy bonding wire according to claim 1, satisfying any two of the conditions (1) to (3), or satisfying all of the conditions (1) to (3).

17. The Ag alloy bonding wire according to claim 1, satisfying at least one of the following conditions (1), (2') and (3'):
       (1) the concentration of Te is 5 to 500 at. ppm;
       (2') the concentration of Bi is 200 to 500 at. ppm; and
       (3') the concentration of Sb is 300 to 1,500 at. ppm.

18. The Ag alloy bonding wire according to claim 1, satisfying the following condition (1):
       (1) the concentration of Te is 5 to 500 at. ppm.

19. The Ag alloy bonding wire according to claim 1, wherein the Ag alloy bonding wire does not have a coating that contains a metal other than Ag as a main component.

20. The Ag alloy bonding wire according claim 1, wherein a total concentration of Ca and a rare earth element as the other elements is 0 at. ppm or more and less than 20 at. ppm.

* * * * *